US010020968B1

(12) United States Patent
Rodenbeck et al.

(10) Patent No.: US 10,020,968 B1
(45) Date of Patent: Jul. 10, 2018

(54) COHERENT RADAR RECEIVER THAT COMPRISES A SIGMA DELTA MODULATOR

(71) Applicants: National Technology & Engineering Solutions of Sandia, LLC, Albuquerque, NM (US); Jose Silva-Martinez, College Station, TX (US); Aydin I. Karsilayan, College Station, TX (US); John Mincey, College Station, TX (US)

(72) Inventors: Christopher T. Rodenbeck, Albuquerque, NM (US); Jose Silva-Martinez, College Station, TX (US); Aydin I. Karsilayan, College Station, TX (US); John Mincey, College Station, TX (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 592 days.

(21) Appl. No.: 14/662,106

(22) Filed: Mar. 18, 2015

(51) Int. Cl.
*H04L 27/227* (2006.01)
*H04L 25/02* (2006.01)
*H04B 1/12* (2006.01)
*G01S 19/14* (2010.01)
*G01S 7/288* (2006.01)

(52) U.S. Cl.
CPC .......... *H04L 27/227* (2013.01); *G01S 7/288* (2013.01); *G01S 19/14* (2013.01); *H04B 1/12* (2013.01); *H04L 25/02* (2013.01)

(58) Field of Classification Search
CPC .... H04L 25/02; H04L 27/227–27/2278; G01S 19/14; G01S 7/285–7/288; G01S 19/13–19/37; H04B 1/12
See application file for complete search history.

(56) References Cited

U.S. PATENT DOCUMENTS

| 5,369,404 | A | * | 11/1994 | Galton | ................... | H03D 3/241 |
| | | | | | | 341/143 |
| 5,448,299 | A | * | 9/1995 | Yang | ..................... | H04N 5/211 |
| | | | | | | 348/470 |
| 5,510,845 | A | * | 4/1996 | Yang | .................... | H04N 5/4401 |
| | | | | | | 348/476 |

(Continued)

OTHER PUBLICATIONS

M. Khoddam, E. N. Aghdam and V. Najafi, "Multi-level asynchronous delta-sigma modulation based ADC," 2012 4th International Conference on Intelligent and Advanced Systems (ICIAS2012), Kuala Lumpur, 2012, pp. 725-728.*

(Continued)

*Primary Examiner* — Matthew M Barker
(74) *Attorney, Agent, or Firm* — Medley, Behrens & Lewis, LLC

(57) ABSTRACT

Described herein are various technologies relating to processing a coherent signal. A receiver is configured to receive an analog signal, and process the analog signal to generate an input analog signal. The input analog signal has been modulated according to a suitable modulation sequence. A coherent signal sampler coherently samples the modulation sequence, and the result of such sampling is in turn used to demodulate the input analog signal. The resultant signal is then passed to a sigma delta modulator, where it is converted to digital form.

20 Claims, 6 Drawing Sheets

(56) References Cited

U.S. PATENT DOCUMENTS

| | | | |
|---|---|---|---|
| 5,708,432 A | 1/1998 | Reynolds et al. | |
| 6,271,773 B1 | 8/2001 | Kobayashi | |
| 6,285,306 B1* | 9/2001 | Zrilic | G06F 7/602 |
| | | | 341/143 |
| 6,366,227 B1* | 4/2002 | Rigby | G01S 7/52046 |
| | | | 341/143 |
| 6,370,184 B1* | 4/2002 | Hellberg | H04B 1/709 |
| | | | 375/150 |
| 6,577,259 B1 | 6/2003 | Jelonnek | |
| 6,972,704 B2 | 12/2005 | Rivoir | |
| 6,975,682 B2 | 12/2005 | Cosand | |
| 7,916,083 B2* | 3/2011 | Thiesen | H01Q 3/2605 |
| | | | 342/372 |
| 9,041,444 B1* | 5/2015 | Tarighat Mehrabani | H03L 7/00 |
| | | | 327/157 |
| 9,412,373 B2* | 8/2016 | Ma | G10L 15/065 |
| 9,720,080 B1* | 8/2017 | Rodenbeck | G01S 13/86 |
| 2004/0252049 A1* | 12/2004 | Vantalon | G01S 19/35 |
| | | | 342/357.43 |
| 2007/0008218 A1* | 1/2007 | Vantalon | G01S 5/0027 |
| | | | 342/357.43 |
| 2012/0068868 A1* | 3/2012 | Ahmed | H03M 3/372 |
| | | | 341/143 |
| 2012/0200453 A1* | 8/2012 | Brosche | G01S 7/288 |
| | | | 342/175 |
| 2013/0141270 A1* | 6/2013 | Rodenbeck | G01S 13/0209 |
| | | | 342/137 |
| 2014/0269978 A1* | 9/2014 | Kiss | H03M 9/00 |
| | | | 375/295 |
| 2015/0103945 A1* | 4/2015 | Maehata | H04L 25/02 |
| | | | 375/295 |
| 2015/0371638 A1* | 12/2015 | Ma | G10L 15/065 |
| | | | 704/275 |
| 2015/0372805 A1* | 12/2015 | Yoon | H04L 7/04 |
| | | | 375/358 |
| 2016/0277173 A1* | 9/2016 | Dutronc | H04W 72/0446 |

OTHER PUBLICATIONS

James C. Candy; Gabor C. Temes, "Oversampling AtoD and DtoA Converters with Multistage Noise Shaping Modulators," in Oversampling Delta-Sigma Data Converters:Theory, Design, and Simulation , 1, Wiley-IEEE Press, 1992, pp. 259-265.*

F. Furuta, K. Saitoh, A. Yoshida and H. Suzuki, "Experimental Evaluation of Signal-to-Noise Ratio of Sigma-Delta Modulator for Superconducting Analog-to-Digital Converter," in IEEE Transactions on Applied Superconductivity, vol. 17, No. 2, pp. 438-441, Jun. 2007.*

M. Neitola and T. Rahkonen, "An analog correlator for a WCDMA receiver," 2000 IEEE International Symposium on Circuits and Systems. Emerging Technologies for the 21st Century. Proceedings (IEEE Cat No. 00CH36353), Geneva, 2000, pp. 753-756 vol. 4. doi: 10.1109/ISCAS.2000.858861 (Year: 2000).*

Rodenbeck, et al., "Monobit Subsampler for Digital Downconversion in Pulse-Doppler Radar Applications," IEEE Transactions on Microwave Theory and Techniques, vol. 57, Issue 5, May 2009, pp. 1036-1043.

Rodenbeck, et al., "Delta Modulation Technique for Improving the Sensitivity of Monobit Subsamplers in Radar and Coherent Receiver Applications," IEEE Transactions on Microwave Theory and Techniques, vol. 62, Issue 8, Aug. 2014, pp. 1811-1822.

* cited by examiner

US 10,020,968 B1

COHERENT RADAR RECEIVER THAT COMPRISES A SIGMA DELTA MODULATOR

STATEMENT OF GOVERNMENTAL INTEREST

This invention was developed under Contract DE-AC04-94AL85000 between Sandia Corporation and the U.S. Department of Energy. The U.S. Government has certain rights in this invention.

BACKGROUND

A monobit coherent receiver is configured to receive and process coherent (pulsed) signals utilizing a 1-bit analog-to-digital converter (ADC). This relatively simple single bit ADC, however, is associated with quantization noise, particularly when used to process relatively high bandwidth signals. This can be particularly disadvantageous in, for example, conventional Doppler pulse radar receivers, where bandwidth of an echo signal subjected to conversion by the single bit ADC can be relatively high. This may result in complexities in noise reduction in the digital domain, suboptimal resolution in a processed signal, relatively high thermal noise, amongst other undesirable effects.

SUMMARY

The following is a brief summary of subject matter that is described in greater detail herein. This summary is not intended to be limiting as to the scope of the claims.

Described herein are various technologies relating to a system that includes a receiver, wherein the receiver is configured to receive and process coherent (pulsed) signals. In an example, the system can be a Doppler pulse radar system, a global positioning system (GPS), a radiofrequency identifier (RFID) system, etc. The aforementioned receiver can have an integrated circuit (IC) therein. The IC can include, for example, a coherent signal sampler that is configured to generate a reference signal. The reference signal can be an impulse (pulse) modulation of a pseudo-random sequence used to modulate a transmitted signal (e.g., emitted from the pulse Doppler radar system, a GPS transmitter, an RFID transmitter, etc.). Thus, for example, the coherent signal sampler can modulate the pseudorandom sequence by an impulse train, wherein a frequency of the impulse train can map to a data rate of the transmitted signal (e.g., a 1 MHz impulse train), thereby generating the reference signal.

The receiver is further configured to demodulate an (analog) input signal by the reference signal to form an (analog) baseband signal. The input signal can be a function of a pulsed signal received at an antenna of the receiver. The demodulation of the input signal by the reference signal, when the system is a pulse Doppler radar system, results in a Doppler tone.

The IC can further comprise a ΣΔ (sigma delta) modulator that is configured to convert the baseband signal to a digital output signal. An advantage of the sigma delta modulator is reduction of quantization noise compared to conventional quantizers. Further, the baseband signal, due to the above-mentioned demodulation, has a relatively low bandwidth; accordingly, a relatively low bandwidth sigma delta modulator can be used to perform the analog to digital conversion.

The above discussion presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
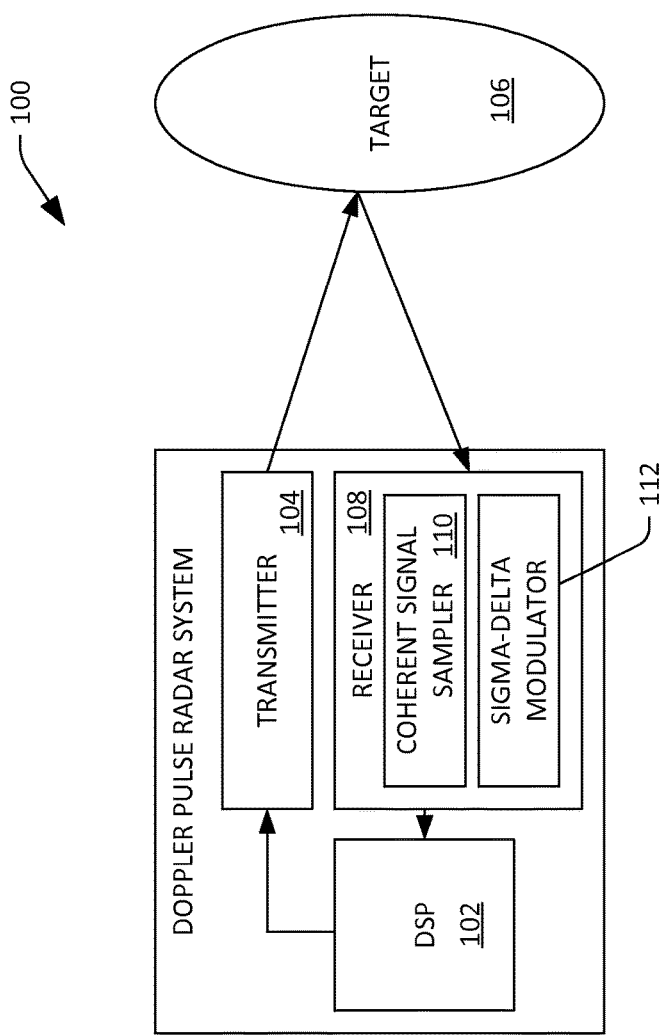
FIG. 1 is a functional block diagram of an exemplary Doppler pulse radar system.

Various technologies pertaining to a coherent receiver that includes a sigma delta modulator are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Further, as described herein, some aspects may be performed via execution of software. For example, systems described herein can include digital signal processors (DSPs), which can be programmed to perform various signal processing functions. Aspects described herein are configured to encompass suitably programmed DSPs, wherein the DSPs can be configured to execute a routine, a function, or the like. Further, as used herein, the term "exemplary" is intended to mean serving as an illustration or example of something, and is not intended to indicate a preference.

With reference now to FIG. 1, a functional block diagram of an exemplary Doppler pulse radar system 100 is illustrated. The Doppler pulse radar system 100 includes a digital signal processor (DSP) 102 that is configured to at least partially define a radar waveform that is to be transmitted by the system 100. To that end, the Doppler pulse radar system 100 includes a transmitter 104 that is configured to receive the (digital) waveform output by the DSP 102, convert the waveform to an analog format, amplify the waveform, and transmit an output signal. As can be ascertained, the output signal is a coherent (pulsed) signal, wherein such signal is modulated by a pseudorandom sequence. In an example, the DSP 102 can perform the above-referenced modulation through binary phase-shift keying (BPSK), such that the pseudorandom sequence is a BPSK sequence, which may be retained in memory. In other examples, the modulation can be performed by analog componentry in the transmitter 104. The output signal is directed towards a target 106, and at least a portion of the output signal reflects from the target 106. The reflected portion of the output signal can be referred to as an echo signal. In an example, the echo signal may have a negative signal to noise (SNR) ratio, and the Doppler pulse radar system 100 is particularly well-suited for processing signals with negative SNR.

The Doppler pulse radar system 100 also includes a receiver 108 that is configured to receive and process this echo signal. Accordingly, while not shown, the receiver 108 can include an antenna, componentry to down-convert the signal, a low noise amplifier (LNA), a matched filter, and other componentry that is conventionally included in radar receivers. The antenna of the receiver 108 is configured to receive the echo signal, process the echo signal to generate a digital signal, and output the digital signal to the DSP 102.

With more detail, the receiver 108 includes a coherent signal sampler 110. The coherent signal sampler 110 is configured to receive an analog input signal ($S_{IN}$), wherein $S_{IN}$ is a function of the echo signal received at the antenna of the receiver 108. For example, $S_{IN}$ can be the output of a matched filter in the receiver 108. Accordingly, $S_{IN}$ is an analog signal that has been modulated by the pseudorandom sequence. The coherent signal sampler 110 is configured to generate a reference signal ($S_{REF}$) that is suitable for demodulating $S_{IN}$. For instance, the coherent signal sampler 110 can be configured to sample the pseudorandom sequence by an impulse (or pulse) train that is clocked in accordance with the data rate corresponding to the output signal.

The receiver 108 can be configured to demodulate $S_{IN}$ using $S_{REF}$, resulting in formation of a baseband signal ($S_{BB}$). $S_{BB}$ represents a Doppler frequency (plus some noise, such as thermal noise and other noise that may be associated with signal processing). The receiver 108 additionally comprises a ΣΔ (sigma delta) modulator 112 that is configured to convert $S_{BB}$ to the digital output signal. In an exemplary embodiment, the sigma delta modulator 112 may act as a 1-bit (monobit) ADC. In other examples, the sigma delta modulator 112 may act as a multi-bit ADC. As noted above, the receiver 108 can be configured to output the digital signal formed by the sigma delta modulator 112 to the DSP 102. The DSP 102 may then perform suitable processing (in the digital domain) over the digital signal to determine, for example, location of the target 106 relative to the Doppler pulse radar system 100, direction of movement of the target 106 relative to the Doppler pulse radar system 100, velocity of the target 106 relative to the Doppler pulse radar system 100, etc.

Optional alternatives pertaining to the Doppler pulse radar system 100 are now set forth. While the transmitter 104 and the receiver 108 are shown in FIG. 1 as being in communication with the DSP 102, the transmitter 104 and the receiver 108 may have their own respective DSPs, wherein such DSPs may be in communication with one another (e.g., the DSP in communication with the transmitter 104 can provide a BPSK sequence to the DSP of the receiver 108).

Further, in an example, the coherent signal sampler 110 and the sigma delta modulator 112 may be formed on a single integrated circuit (IC). Moreover, for instance, at least one of the coherent signal sampler 110 and the sigma delta modulator 112 may be implemented as a switched capacitor circuit. An exemplary implementation of the coherent signal sampler 110 and the sigma delta modulator 112 on an IC is set forth below.

The Doppler pulse radar system 100 exhibits various advantages over conventional Doppler pulse radar systems. For example, the (SNR) in the digital signal output by the sigma delta modulator 112 is higher compared to SNRs of signals in the digital domain of conventional Doppler pulse radar systems. This enhancement of SNR is at least partially due to a reduction in quantization noise associated with sigma delta modulators. Additionally, the above-noted increase in SNR is a result of a reduction in thermal noise that corresponds to the design, wherein such reduction is at least partially due to the sigma delta modulator 112 being a relatively low bandwidth sigma delta modulator (e.g., between 10 KHz and 30 KHz).

While FIG. 1 depicts the Doppler pulse radar system 100, it is to be understood that the receiver 108 can be incorporated into other systems that are configured to receive coherent (pulsed) signals, potentially with negative SNR. For instance, the receiver 108 may be or may be included in a global positioning system (GPS) receiver. In another example, the receiver 108 may be or be included in a radio frequency identifier (RFID) receiver.

Figure 2:
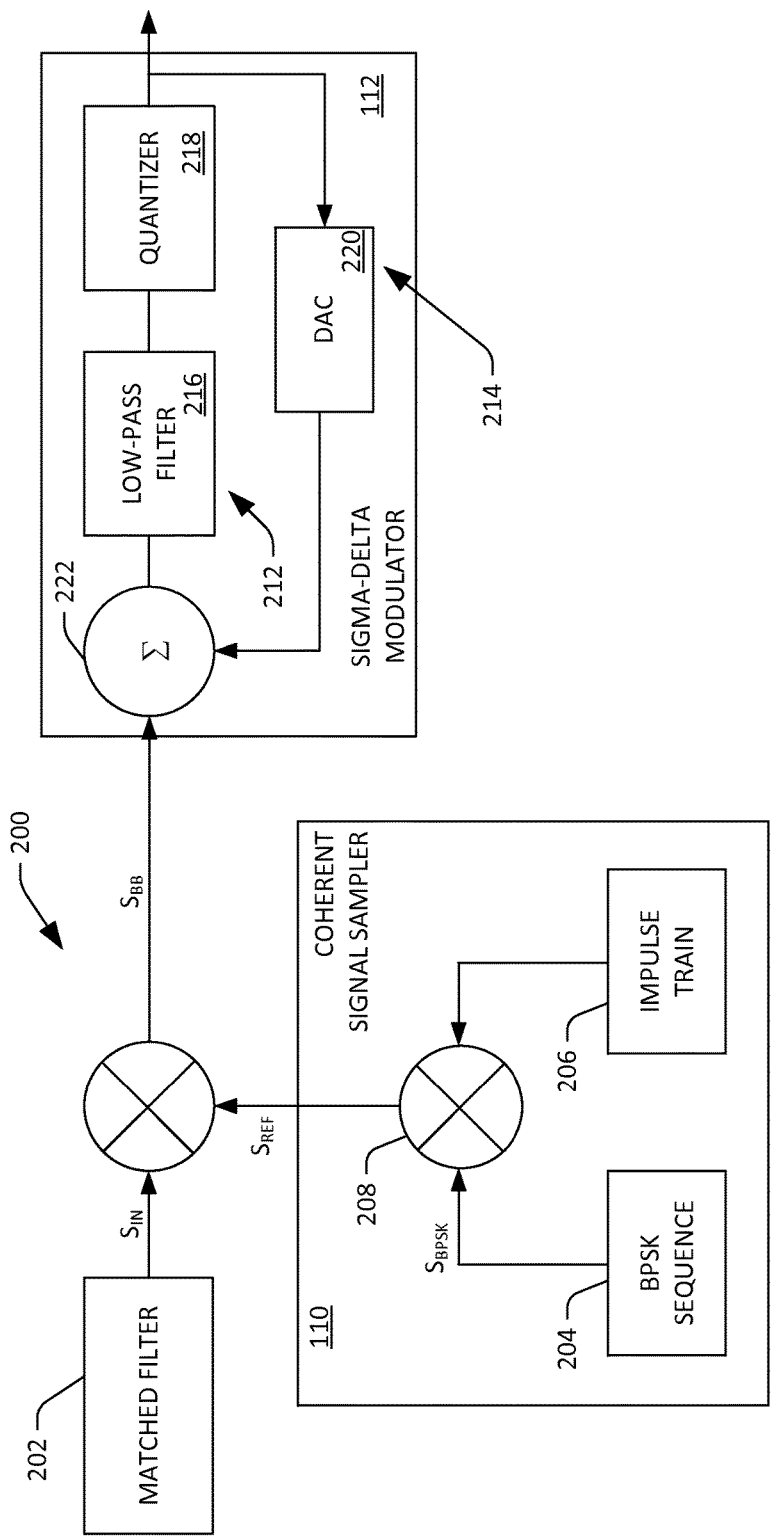
FIG. 2 is a schematic diagram of a portion of a receiver.

Now referring to FIG. 2, a functional block diagram of an exemplary system 200 that includes the coherent signal sampler 110 and the sigma delta modulator 112 is illustrated. The system 200 includes a matched filter 202 that can receive, for example, output of a low noise amplifier (LNA) of the receiver 108. The matched filter 202 performs conventional filtering operations on an analog signal received thereby, and outputs $S_{IN}$.

The coherent signal sampler 110 includes or has access to a pseudorandom sequence, wherein the output signal has been modulated by the pseudorandom sequence. Accordingly, as the echo signal is a reflected portion of the output signal, and $S_{IN}$ is based upon the echo signal, $S_{IN}$ can include frequency information modulated by the pseudorandom sequence. As shown in FIG. 2, the pseudorandom sequence can be a BPSK sequence 204. The BPSK sequence 204 can be included in a signal over time, resulting in signal $S_{BPSSK}$.

The coherent signal sampler 110 also includes circuitry 206 that generates an impulse (or pulse) train. The coherent signal sampler 110 further comprises a multiplier 208 that multiplies $S_{BPSK}$ by the impulse train, such that the BPSK sequence is sampled at an appropriate rate (e.g., the rate of the impulse (or pulse) train). This results in formation of a reference signal ($S_{REF}$), which is output by the coherent signal sampler 110. The system 200 further comprises a second multiplier 210 that is configured to multiply $S_{IN}$ by $S_{REF}$, thus, de-modulating $S_{IN}$ and forming $S_{BB}$.

The sigma delta modulator 112 is operably coupled to the second multiplier 210, and receives $S_{BB}$ output by the second multiplier 210. The sigma delta modulator 112 includes a feed-forward loop 212 and a feedback loop 214. The feed-forward loop 212 includes a low pass filter 216. The low pass filter 216 is configured to provide noise-shaping. The feed-forward loop 212 also includes a quantizer 218, which is operably coupled to the low pass filter 216. The quantizer 218 outputs a quantized (digital) signal. In an example, the quantizer 218 can be a 1-bit quantizer. In other examples, the quantizer 218 may be a multi-bit quantizer.

The feedback loop 214 includes a digital-to-analog converter (DAC) 220, which is operably coupled to the output of the quantizer 218. Accordingly, the DAC 220 receives the digitized signal output by the quantizer 218. In an example, the DAC 220 may be a single-bit DAC. In other examples, the DAC 220 may be a multi-bit DAC. The DAC 220 outputs an analog signal, which is summed with the baseband signal by a summing module 222. The low pass filter 216 is coupled to the summing module 222 and receives the output of such module 222.

Operation of the system 200 will now be described in greater detail. As described above, the coherent signal sampler 110 is configured to sample $S_{BPSK}$ coherently by a train of impulses (e.g., a 1 MHz train of impulses). $S_{REF}$ is thus a train of impulses modulated according to the sequence determined by the BPSK sequence 204. The resulting spectrum is composed by a sequence of replicas of the BPSK sequence. It is to be noted that this operation can be realized in the digital domain. Two advantages of this approach are as follows: 1) the approach is relatively simple to implement and reduces the noise level; and 2) pulse modulation can be used instead of impulse modulation. The BPSK modulated train of impulses ($S_{REF}$) output by the coherent signal sampler 110 can be described by the following expression:

$$S_{Ref}(t) = S_{Ref}(t) = BPSK \times \{\Sigma_{n=-\infty}^{\infty} \delta(t-nT)\}, \quad (1)$$

where t is time, T is a sampling period, and $\delta$ is the impulse function.

The modulated train of impulses convolves the incoming signal $S_{IN}(t)$, generating a low-frequency signal, where the Doppler frequency is visible:

$$S_{BB}(t) = \{\alpha \times BPSK \times \sin((\omega_I + \omega_D)t) + noise_{total}\} \times BPSK \times \{\Sigma_{n=-\infty}^{\infty} \delta(t-nT)\}, \quad (2)$$

where $\alpha$ is the attenuation factor of the echo signal, $\omega_I$ is an intermediate frequency component, $\omega_D$ is a Doppler frequency component, and $noise_{total}$ represents incoming noise.

This operation comprises multiple operations needed to extract the Doppler frequency. Eq. (2) can be re-arranged as follows:

$$S_{bb}(t) = \alpha \times BPSK^2 \times \sin(\omega_D t) + noise_{total2}, \quad (3)$$

where $noise_{total2}$ is the total in-band noise after the coherent BPSK modulated sampling. It can be noted that the coherent impulse modulation is a digital operation. Instead of using a train of impulses, pulses can be used if an analog mixer is sensitive to one of the edges. The Doppler frequency is present after these operations and can be extracted employing the sigma delta modulator 112 (which can be a low frequency sigma delta modulator). For example, the sigma delta modulator 112 can be a 20 kHz sigma delta modulator, and can digitize $S_{BB}$ with a clock frequency of 1 MHz to cause $S_{BB}$ to be compatible with the frequency of the coherent signal sampler 110.

The impulse (or pulse) modulation of the BPSK results in a modulated impulse (pulse) train. This modulation can be performed in software or using digital circuits, such that the operation is, in principle, noise free. As discussed above, with respect to Eq. (1), it was shown that this impulse modulation can generate multiple coherent replicas of the BPSK spectrum. This operation can be exploited, for example, if switched capacitor circuits are used.

While FIG. 2 illustrates an exemplary arrangement of the receiver 108, other designs are also contemplated. For example, the coherent signal sampler 110 may utilize only the impulse train 206. In such case, the digital output from the sigma delta modulator 112 can be de-modulated using the BPSK sequence 204. In yet another example, the input signal can be convolved with an intermediate frequency (IF) modulated BPSK. For instance, the IF-modulated BPSK signal can be represented by the following relationship:

$$S_{Ref}(t) = BPSK \times \sin(\omega_I t). \quad (4)$$

Figure 3:
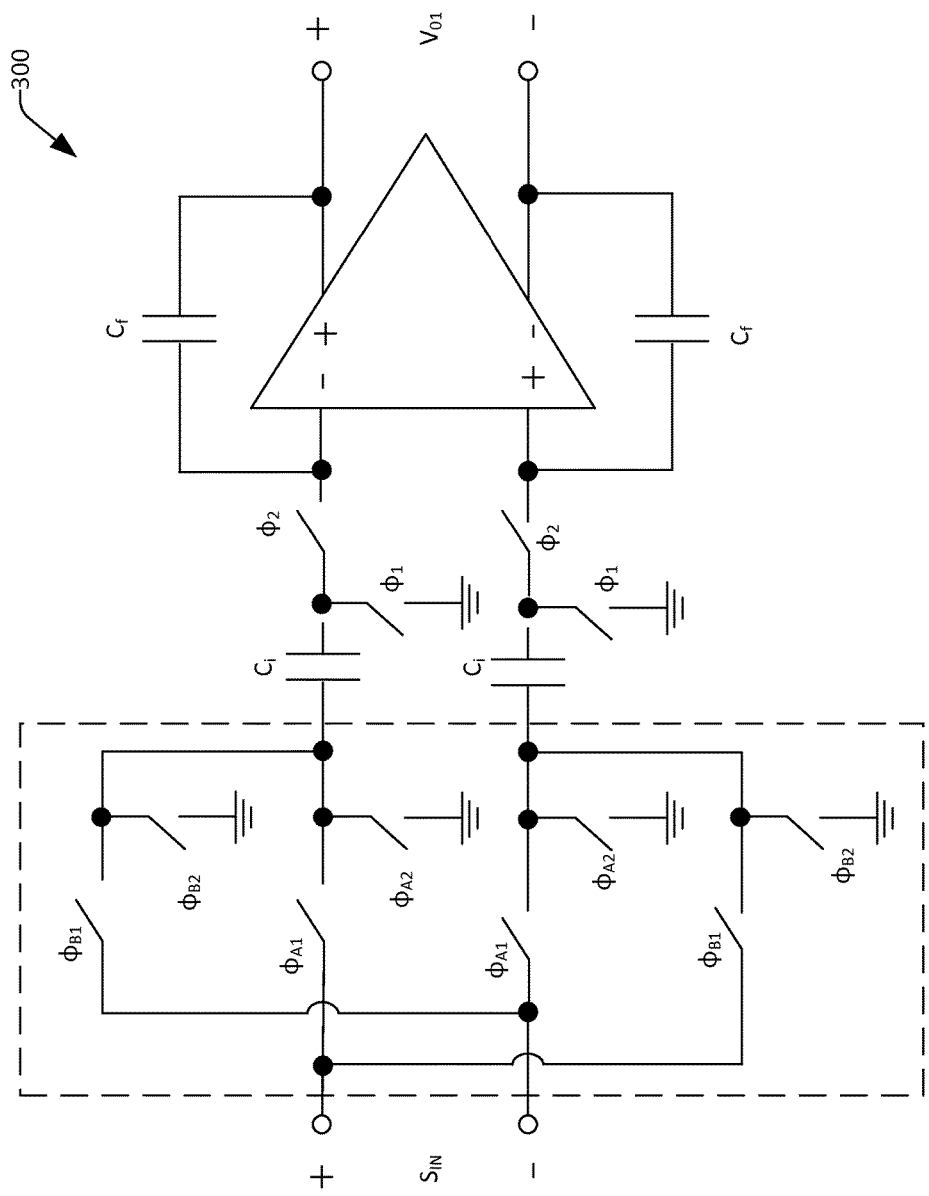
FIG. 3 is an exemplary implementation of a coherent signal sampler.

Turning to FIG. 3, an exemplary implementation of the coherent signal sampler 110 is illustrated. As shown, the coherent signal sampler 110 can be implemented as a switched capacitor circuit. The input signal $S_{IN}$, then, is coherently sampled by the BPSK modulated train of pulses. This can be implemented using a regular sample and hold, which can be driven by the modulated pulse that holds the sampled (instantaneous) value. The realization can be simplified if switched capacitor techniques are used. In this case, the sample and hold circuit can be implemented as part of the input switched capacitor. Further, the BPSK modulation can be implemented by properly manipulating the clock scheme of the input stage of the switched capacitor circuit.

The switched capacitor circuit shown in FIG. 3 utilizes generation of regular, but synchronized (with a master clock used to generate the BPSK sequence) non-overlapping clocks $\phi_1$ and $\phi_2$. The circuit includes four input switches $\phi_{A1}$, $\phi_{B1}$, $\phi_{A2}$, and $\phi_{B2}$. These switches are synchronized with the clocks $\phi_1$ and $\phi_2$, and also modulated by the BPSK sequence. This implementation, thus, requires few conventional digital circuits. The modulated clock phases can be implemented using the following logical functions.

$$\phi_{A1} = BPSK \times \phi_1$$

$$\phi_{A2} = BPSK \times \phi_2$$

$$\phi_{B2} = \overline{BPSK} \times \phi_2 \quad (5)$$

If BPSK is 1, then $\phi_{A1} = \phi_1$, $\phi_{A2} = \phi_2$ and $\phi_{B1} = \phi_{B2} = 0$. In this case, the circuit operates as a non-inverting discrete integrator whose output at the end of phase $\phi_2$ is expressed as follows:

$$v_{01}(nT) = \left(\frac{C_i}{C_f}\right) S_{in}\left(nT - \frac{T}{2}\right) + v_{01}(nT - T). \quad (6)$$

It can be noted that the sampling operation is embedded in this equation. The output voltage $v_{01}$ monitored at the end of $\phi_2$ (t=nT) is thus a function of the initial condition stored in the capacitor (discrete integration) and the weighted value of the value of the input signal sampled at t=nT−T/2.

It can be ascertained that the switched capacitor circuit 300 shown in FIG. 3 includes an amplifier. Two items can be noted: 1) the output of the amplifier is sampled by the following capacitor at t=nT; 2) if phase $\phi_2$ is used to drive the circuit 300, then the sampled value is given by Eq. (6).

The amplifier can also be sampled at the end of $\phi_1$. In this case, the output of the amplifier will show a full delay with respect to the time the input was sampled. The sampled value is then determined by the following equation:

$$v_{01}\left(nT + \frac{T}{2}\right) = \left(\frac{C_i}{C_f}\right) S_{in}\left(nT - \frac{T}{2}\right) + v_{01}(nT - T). \quad (7)$$

A designer of the receiver 108 has the flexibility of choosing the phases accordingly, to guaranteed loop stability. Other possibilities exist if the clock phases are arranged differently.

The case can be considered when the BPSK signal is 0. In this case, $\phi_{B1}=\phi_1$, $\phi_{B2}=\phi_2$ and $\phi_{A1}=\phi_{A2}=0$ The switched capacitor circuit 300 operates in the same way as before, but now the output voltage at t~nT becomes an inverting integrator, as shown here:

$$v_{01}(nT) = -\left(\frac{C_i}{C_f}\right)S_{in}\left(nT - \frac{T}{2}\right) + v_{01}(nT - T). \tag{8}$$

According to Eqs. (7) and (9) (shown below), it follows that:
  i) the input switches are able to implement the instantaneous sampling operation. The output voltage evaluated at the end of the integrating phase $\phi_2$ is a function of the input signal evaluated (instantaneous sampling) at the end of clock phase $\phi_1$;
  ii) simple logic AND functions allow generation of the derived clock phases that implement the BPSK modulation without additional analog resources;
  iii) jitter in the derived clocks is detrimental and may introduce typical aperture noise. There are well-established formulas that allow evaluation of aperture noise as a function of clock jitter and signal slew rate. In an example, if $S_{IN}$ is placed at intermediate frequency of 40 MHz, it can be expected that the clock jitter will be around or less than 250 psecs (less than 1% of the intermediate frequency period=$0.01/40e^6$).
  iv) the switched capacitor circuit is incorporated into a discrete integrator. The operational amplifier serves three purposes: 1) it allows for completion of the sampling operation; 2) it functions as an integrator that can be used as the first stage of the loop filter in the sigma delta modulator 112, and 3) it allows for use of switched capacitor techniques for the implementation of a feedback digital-to-analog converter.
  v) when a single bit quantizer is used, the DAC 220 will also be single bit. The DAC 220 can be incorporated in the system by adding capacitors in an array of switches, together with a reference (clean) voltage source. Details of this will be set forth below.

In the frequency domain, employing the Z-domain transformation, it can be as shown that Eq. (7) can also be expressed as follows:

$$\frac{V_{01}(z)}{S_{in}(z)} = \left(\frac{C_i}{C_f}\right)\left(\frac{z^{-1/2}}{1 - z^{-1}}\right). \tag{9}$$

This corresponds to the equation of a discrete non-inverting integrator with a half period delayed output.

Figure 4:
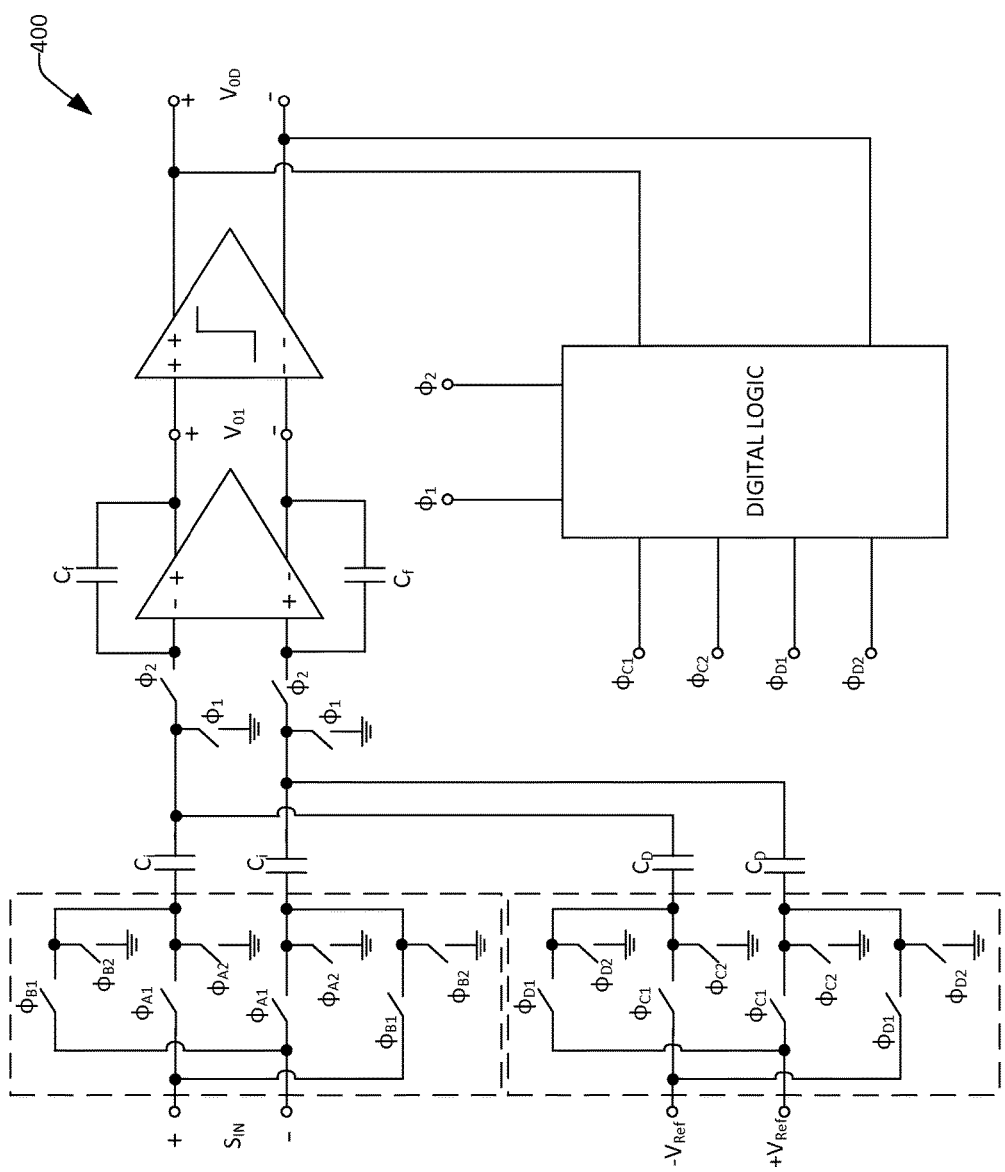
FIG. 4 illustrates an exemplary configuration of the portion of the receiver shown in FIG. 2.

Turning to FIG. 4, a schematic of at least a portion 400 of the receiver 108 is illustrated. The schematic illustrates the first order switched capacitor loop filter, but can be extended to a second order loop, if desired. The architecture employs a single bit quantizer and single bit DAC. Since the loop delay is $Z^{-1}$, it is desirable to limit the closed loop bandwidth to $f_s/8$, where $f_s$ is the sampling period. At this frequency, the excess phase introduced by the delay element is 45°. The excess phase of the integrator is around −90° at the unity loop gain frequency, leading to a loop phase margin of 45°, which is sufficient to guaranteed loop stability.

The DAC comprises an array of switches that connect the feedback capacitors to $V_{ref}$ or $-V_{ref}$ during $\phi_2$, according to $V_{OD}$. The switches embedded in the feedback loop operate in a similar fashion as the ones used in the coherent input signal sampler. The switches are controlled by a simple digital logic system that includes a few gates with the functionality given by Eq. (10):

$$\phi_{C1} = V_{OD} \times \phi_1$$

$$\phi_{C2} = V_{OD} \times \phi_2$$

$$\phi_{D1} = \overline{V_{OD}} \times \phi_1$$

$$\phi_{D2} = \overline{V_{OD}} \times \phi_2 \tag{10}$$

The loop gain can be obtained using the following algorithm:

$$L_{gain}(z) = -\left(\frac{C_D}{C_f}\right)\left(\frac{z^{-1}}{1 - z^{-1}}\right) \tag{11}$$

The signal and noise transfer functions may then be computed as follows:

$$STF(z) = \frac{\left(\frac{C_i}{C_f}\right)\left(\frac{z^{-1}}{1-z^{-1}}\right)}{1 + \left(\frac{C_D}{C_f}\right)\left(\frac{z^{-1}}{1-z^{-1}}\right)} = \frac{\left(\frac{C_i}{C_f}\right)z^{-1}}{1 + \left(\frac{C_D}{C_f} - 1\right)z^{-1}}; \tag{12}$$

$$NTF(z) = \frac{1}{1 + \left(\frac{C_D}{C_f}\right)\left(\frac{z^{-1}}{1-z^{-1}}\right)} = \frac{1 - z^{-1}}{1 + \left(\frac{C_D}{C_f} - 1\right)z^{-1}}. \tag{13}$$

It can be noted that for the case $C_i=C_D=C_f$, these equations reduce to the following simpler expressions:

$$STF(z) = z^{-1} \tag{14}$$

$$NTF(z) = 1 - z^{-1} = Z^{-1/2}(Z^{1/2} - Z^{-1/2}) = Z^{-1/2}\left(2j\sin\left(\frac{\omega T}{2}\right)\right). \tag{15}$$

It can further be noted from Eq. (14) that the loop's integrator does not filter the input signal, and accordingly, the spectrum at the input of the signal $S_{IN}$ is to be bandlimited. The signal to quantization noise can now be computed. Although not accurate, it can be assumed that the quantization noise is random with a noise power density given by $Q(z)^2$, such that first order approximations can be obtained:

$$SQNR = \frac{|S_{in}Z^{-1}|^2}{\left|\int_0^{f_b}(Q(z)NTF(z))^2 df\right|} = \frac{|S_{in}|^2}{|Q(z)|^2\left|\int_0^{f_b}(NTF(z))^2 df\right|} \tag{16}$$

$$SQNR = \left(\frac{|S_{in}|^2}{|Q(z)|^2 f_b}\right) \times \left|\frac{f_b}{\int_0^{f_b}\left(2\sin\left(\frac{\omega T}{2}\right)\right)^2 df}\right| =$$

$$(SQNR_{quantizer}) \times \left|\frac{f_b}{\int_0^{f_b}\left(2\sin\left(\frac{\omega T}{2}\right)\right)^2 df}\right|$$

The first term represents the signal power-to-quantization noise ratio of the standalone single bit quantizer. The second term represents the benefit in SQNR due to the closed loop operation of the sigma delta modulator 112. The following can be assumed:

$$SQNR \cong (SQNR_{quantizer}) \times \left(\frac{3}{\pi^2} \times \left(\frac{f_s}{2f_b}\right)^3\right) = \quad (17)$$

$$(SQNR_{quantizer}) \times \left(\frac{3}{\pi^2} \times OSR^3\right)$$

Given such assumption, in a first order approximation, the SQNR of the sigma delta modulator 112 improves −5.2+30×log 10(OSR) dB with respect to the quantizer's SQNR. For the case of OSR=10, the improvement is approximately 24.8 dB.

Employing the classic equation for SQNR of the standalone quantizer (A/D) given by 6.02N+1.76 dB, Eq. (16) simplifies for the case of a single bit quantizer to the following:

$$SQNR(dB) \cong 6.02+1.76-5.2+30\times\log 10(OSR)=2.58+ \\ 30\times\log 10(OSR) \quad (18)$$

The SQNR of the standalone quantizer is approximately equal to the 6.02+1.76 dB=7.78 dB.

The single bit first order sigma delta modulator can reduce quantization noise by more than 25 dB with respect to the standalone one bit quantizer. This reduction in quantization noise also drastically reduces the correlation between quantization noise and the input signal $S_{IN}$. The remaining noise is then more random, making more effective the de-noising techniques conventionally used in the digital domain.

In summary, the design shown in FIG. 4 is particularly well-suited for receivers of a first type, which includes coherent receivers such as radar receivers, GPS receivers, etc., but may not be particularly well-suited for receivers of a second type, such as those used in communications systems. This is because, for example, in radar systems, the modulating sequence used to modulate emitted signals (e.g., radar signals) is known. The portion 400 of the receiver shown in FIG. 4 is configured to remove the modulating sequence in $S_{IN}$ during the sampling process (prior to quantization), and is further configured to do so by switching the polarity of the sample and hold circuit shown in FIG. 3. This, in turn, allows the sigma-delta modulator to process information at the Doppler bandwidth rather than the full modulation bandwidth, which can significantly reduce SNR at the input to the quantizer 218.

With more specificity, the digital logic controls $\phi_{C1}$, $\phi_{C2}$, $\phi_{D1}$, and $\phi_{D1}$ to flip polarity of the sample and hold circuit, and further controls $\phi_1$ and $\phi_2$ to provide a sample and hold function, which allows for relatively accurate removal of the modulation sequence from $S_{IN}$ during sampling. This, in turn, allows for the analog to digital conversion (quantizing) to be performed at a lower bandwidth. For example, the analog to digital conversion can be over a Doppler bandwidth, rather than the entirety of the bandwidth of $S_{IN}$. In the portion 400 of the receiver shown in FIG. 4, the operational amplifier with the feedback capacitors in parallel therewith ($C_f$) acts as the low pass filter 216, and the comparator in series therewith acts as the quantizer 218.

Further, while the portion 400 of the receiver has been described as removing BPSK modulation from $S_{IN}$, it is to be understood that the portion 400 of the receiver can be configured to remove any suitable vector modulation from $S_{IN}$. For example, the digital logic can be configured to cause phase-shift keying (PSK) modulation to be removed from a received signal ($S_{IN}$), frequency modulation (FM) to be removed from a received signal, or the like.

Figure 5:
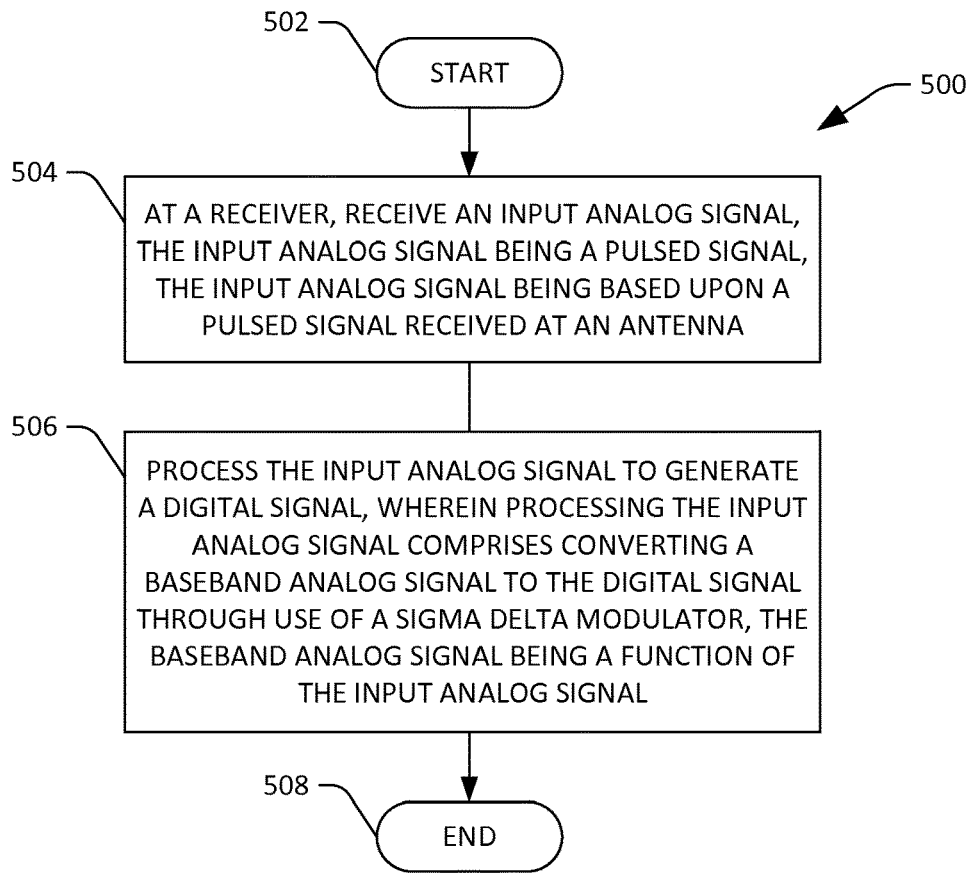
FIG. 5 is a flow diagram that illustrates an exemplary methodology for processing a pulsed signal at a receiver.
Figure 6:
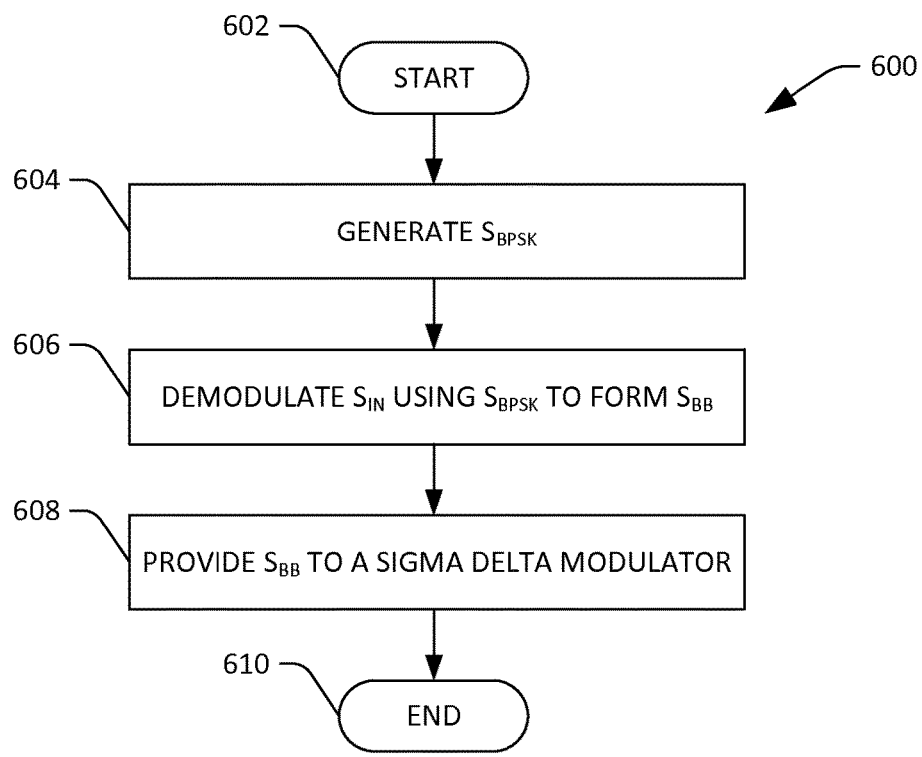
FIG. 6 is a flow diagram of another exemplary methodology for processing a pulsed signal (with a negative signal-to-noise ratio (SNR)) at a receiver.

FIGS. 5-6 illustrate exemplary methodologies relating to digitizing a signal. While the methodologies are shown and described as being a series of acts that are performed in a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement a methodology described herein.

Moreover, the acts described herein may be computer-executable instructions that can be implemented by one or more processors and/or stored on a computer-readable medium or media. The computer-executable instructions can include a routine, a sub-routine, programs, a thread of execution, and/or the like. Still further, results of acts of the methodologies can be stored in a computer-readable medium, displayed on a display device, and/or the like.

Referring now to FIG. 5, an exemplary methodology 500 for processing an input analog signal is illustrated. The methodology 500 starts at 502, and at 504, at a receiver, an input analog signal is received. The input analog signal can be a pulsed signal (e.g., with negative SNR). Further, the input analog signal can be based upon a pulsed analog signal received at an antenna.

At 506, the input analog signal is processed to generate a digital signal. Processing the input analog signal comprises converting a baseband analog signal to the digital signal through use of a sigma delta modulator, where the baseband analog signal is a function of the input analog signal. The methodology 500 completes at 508.

With reference to FIG. 6, an exemplary methodology 600 for processing an analog signal is illustrated. The methodology 600 starts at 602, and at 604 $S_{BPSK}$ is generated (e.g., by coherently sampling from a BPSK sequence). At 606, $S_{IN}$ is demodulated based upon $S_{BPSK}$ to recover Doppler frequency information (e.g., $S_{BB}$). At 608, $S_{BB}$ is provided to a sigma delta modulator, which converts $S_{BB}$ to a digital signal. The methodology 600 completes at 610.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:
1. A system that is configured to receive and process coherent signals, the system comprising:
   a receiver that comprises:
      an antenna that is configured to receive a pulsed signal; and
      an integrated circuit that comprises:
         a coherent signal sampler that is configured to coherently sample a pseudorandom sequence to generate a reference signal, the pseudorandom sequence used to modulate a transmitted signal, the pulsed signal based upon the transmitted signal; and a sigma delta modulator, the sigma delta modulator configured to receive an analog signal and convert the analog signal to a digital signal, the analog signal based upon the pulsed signal and the reference signal.

2. The system of claim 1 being a radio frequency identifier (RFID) system.

3. The system of claim 1 being a global positioning system (GPS) system.

4. The system of claim 1 being a pulsed radar system.

5. The system of claim 1, wherein the pseudorandom sequence is a BPSK sequence.

6. The system of claim 1, the coherent signal sampler is configured to coherently sample the pseudorandom sequence based upon a 1 MHz impulse train.

7. The system of claim 1, wherein the integrated circuit further comprises a multiplier, the multiplier configured to multiply an input signal by the reference signal to generate the analog signal, the input signal based upon the pulsed signal received by the antenna.

8. The system of claim 7, wherein at least one of the sigma delta modulator, the coherent sampler, or the multiplier is implemented in the integrated circuit as a switched capacitor circuit.

9. The system of claim 1, wherein the pulsed signal has a negative signal to noise ratio.

10. The system of claim 1, the sigma delta modulator comprises a feed forward loop and a feedback loop, the feed forward loop comprises a 1-bit quantizer, and the feedback loop comprises a 1-bit digital to analog converter.

11. A system comprising:
a transmitter that is configured to transmit an output analog signal towards a target, the output analog signal being a pulsed signal; and
a receiver comprising:
an antenna that receives an echo signal, the echo signal being the output analog signal responsive to the output analog signal reflecting off of the target;
an integrated circuit that is operably coupled to the antenna, the integrated circuit configured to receive an input analog signal, the input analog signal being a pulsed signal, the input analog signal based upon the echo signal received at the antenna, the integrated circuit comprises:

a coherent signal sampler that is configured to coherently sample a pseudorandom sequence to generate a reference signal, the pseudorandom sequence used to modulate the output analog signal, the input analog signal based upon the reference signal; and a sigma delta modulator that converts a baseband analog signal to a digital signal, the baseband analog signal being a function of the input analog signal.

12. The system of claim 11, wherein the echo signal has a negative signal to noise ratio.

13. The system of claim 11, the receiver being a Doppler-pulsed radar receiver.

14. The system of claim 11, wherein the integrated circuit is further configured to form the baseband signal by multiplying the input analog signal by the reference signal.

15. The system of claim 14, the pseudorandom sequence being a BPSK sequence.

16. The system of claim 11, the sigma delta modulator comprises a feed forward loop and a feedback loop, the feed forward loop comprises a 1-bit quantizer, and the feedback loop comprises a 1-bit digital to analog converter.

17. A coherent radar receiver comprising:
antenna means for receiving a pulsed signal;
sampling means for coherently sampling a pseudorandom sequence to generate a, reference signal, the pseudorandom sequence used to modulate a transmitted signal, the pulsed signal based upon the transmitted signal; and
converting means that comprises a sigma delta modulator, the sigma delta modulator configured to receive an analog signal and convert the analog signal to a digital signal, the analog signal based upon the pulsed signal and the reference signal.

18. The coherent radar receiver of claim 17, the pseudorandom sequence being a BPSK sequence.

19. The coherent radar receiver of claim 17, further comprising multiplying means for multiplying an input signal by the reference signal to generate the analog signal, the input signal based upon the pulsed signal received by the antenna means.

20. The coherent radar receiver of claim 17, further comprising forming means for forming a baseband signal, wherein the converting means converts the analog signal to the digital signal based upon the baseband signal.

* * * * *